United States Patent
Lee et al.

(10) Patent No.: US 11,287,446 B2
(45) Date of Patent: Mar. 29, 2022

(54) SPLIT THIN-FILM PROBE CARD

(71) Applicant: CHUNGHWA PRECISION TEST TECH. CO., LTD., Taoyuan (TW)

(72) Inventors: Wen-Tsung Lee, New Taipei (TW); Hsun-Tai Wei, Taoyuan (TW); Kai-Chieh Hsieh, Taoyuan (TW); Chao-Chiang Liu, Taoyuan (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 0 days.

(21) Appl. No.: 17/022,094

(22) Filed: Sep. 16, 2020

(65) Prior Publication Data

US 2021/0325430 A1    Oct. 21, 2021

(30) Foreign Application Priority Data

Apr. 20, 2020   (TW) ................................ 109113133

(51) Int. Cl.
*G01R 1/073*   (2006.01)

(52) U.S. Cl.
CPC ....... *G01R 1/0735* (2013.01); *G01R 1/07378* (2013.01)

(58) Field of Classification Search
CPC .......................... G01R 1/07378; G01R 1/0735
See application file for complete search history.

(56) References Cited

U.S. PATENT DOCUMENTS

| | | | | |
|---|---|---|---|---|
| 5,355,079 A | * | 10/1994 | Evans | G01R 1/07342 324/755.05 |
| 5,825,192 A | * | 10/1998 | Hagihara | G01R 31/2887 324/756.03 |
| 6,747,465 B2 | * | 6/2004 | Esashi | G01R 1/07371 324/754.07 |
| 2001/0016437 A1 | * | 8/2001 | Hasegawa | G01R 1/06738 439/67 |
| 2001/0027053 A1 | * | 10/2001 | Hasegawa | G01R 1/06738 439/482 |
| 2003/0214314 A1 | * | 11/2003 | Cherian | G01R 1/0735 324/754.14 |
| 2007/0214875 A1 | * | 9/2007 | Shigeno | G01R 1/06727 73/105 |
| 2017/0074902 A1 | * | 3/2017 | Nagata | G01R 31/2889 |

* cited by examiner

*Primary Examiner* — Paresh Patel
(74) *Attorney, Agent, or Firm* — Li & Cai Intellectual Property Office (57) ABSTRACT

A split thin-film probe card and an elastic module thereof are provided. The elastic module includes an elastic cushion and a thin-film sheet. The elastic cushion has a plurality of partition slots so as to define a plurality of independent elastic segments. The thin-film sheet includes a carrier, a plurality of signal circuits disposed on the carrier, and a plurality of conductive protrusions that are respectively formed on the signal circuits. The carrier has a plurality of grooves so as to divide the carrier into a plurality of action segments respectively disposed on the independent elastic segments. The signal circuits are respectively disposed on the action segments. When any one of the conductive protrusions is pressed, only the corresponding independent elastic segment is deformed through the corresponding signal circuit and the corresponding action segment.

6 Claims, 7 Drawing Sheets

SPLIT THIN-FILM PROBE CARD

CROSS-REFERENCE TO RELATED PATENT APPLICATION

This application claims the benefit of priority to Taiwan Patent Application No. 109113133, filed on Apr. 20, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card, and more particularly to a split thin-film probe card and an elastic module thereof.

BACKGROUND OF THE DISCLOSURE

When conductive protrusions of a conventional thin-film probe card are used to abut against a device under test (DUT) to perform testing thereof, the conductive protrusions are likely to be in a linkage relationship (e.g., a two-dimensional linkage), so that the conductive protrusions would be acted upon by a non-uniform force. Moreover, the conductive protrusions of the conventional thin-film probe card need to be coplanar with each other, so that a distribution range (or a test region) of the conductive protrusions in the conventional thin-film probe card cannot be too large, which limits the development of the thin-film probe card.

SUMMARY OF THE DISCLOSURE

In response to the above-referenced technical inadequacies, the present disclosure provides a split thin-film probe card and an elastic module thereof to effectively improve on the issues associated with conventional thin-film probe cards.

In one aspect, the present disclosure provides a split thin-film probe card, which includes a supporting member, an elastic cushion disposed on the supporting member, and a thin-film sheet. The elastic cushion has a plurality of partition slots so as to define a plurality of independent elastic segments. The thin-film sheet defines an outer region, an inner region spaced apart from the outer region along a height direction, and an extension region that is connected to the outer region and the inner region. The thin-film sheet includes a carrier, a plurality of signal circuits disposed on the carrier, and a plurality of conductive protrusions. The carrier has a portion arranged in the inner region, and the portion of the carrier has a plurality of grooves so as to divide the portion of the carrier into a plurality of action segments respectively disposed on the independent elastic segments. Moreover, portions of the signal circuits arranged in the inner region are respectively disposed on the action segments. The conductive protrusions are arranged in the inner region and are respectively formed on the signal circuits. When any one of the conductive protrusions is pressed, only the corresponding independent elastic segment is deformed through the corresponding signal circuit and the corresponding action segment.

In another aspect, the present disclosure provides an elastic module of a split thin-film probe card, which includes an elastic cushion and a thin-film sheet. The elastic cushion has a plurality of partition slots so as to define a plurality of independent elastic segments. The thin-film sheet defines an outer region, an inner region spaced apart from the outer region along a height direction, and an extension region that is connected to the outer region and the inner region. The thin-film sheet includes a carrier, a plurality of signal circuits disposed on the carrier, and a plurality of conductive protrusions. The carrier has a portion arranged in the inner region, and the portion of the carrier has a plurality of grooves so as to divide the portion of the carrier into a plurality of action segments respectively disposed on the independent elastic segments. Moreover, portions of the signal circuits arranged in the inner region are respectively disposed on the action segments. The conductive protrusions are arranged in the inner region and are respectively formed on the signal circuits. When any one of the conductive protrusions is pressed, only the corresponding independent elastic segment is deformed through the corresponding signal circuit and the corresponding action segment.

Therefore, in the split thin-film probe card and the elastic module of the present disclosure, by virtue of "when any one of the conductive protrusions is pressed, only the corresponding independent elastic segment is deformed through the corresponding signal circuit and the corresponding action segment," a movement linkage of the conductive protrusions of the split thin-film probe card (or the elastic module) can be reduced. Accordingly, the conductive protrusions can be acted upon with a more uniform force, and can firmly abut against metal pads of a DUT. Specifically, the test region (or the distribution range of the conductive protrusions) of the split thin-film probe card can be widened.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 5, a first embodiment of the present disclosure provides a split thin-film probe card 100. The split thin-film probe card 100 includes a supporting member 1, an elastic cushion 2 disposed on the supporting member 1, a thin-film sheet 3 partially disposed on the elastic cushion 2, and a circuit board 4 that is fixed on the supporting member 1. The elastic cushion 2 and the thin-film sheet 3 in the present embodiment can be jointly defined as an elastic module, and the elastic module can be independently used (e.g., sold) or can be used in cooperation with other components, but the present embodiment is not limited thereto.

The supporting member 1 includes a board 11, a support 12 disposed on the board 11, and at least one coaxial connector 13 that is fastened to the board 11, but the present embodiment is not limited thereto. In other embodiments of the present disclosure, the board 11 and the support 12 can be integrally formed as a one-piece structure. Specifically, the support 12 is a protruding portion formed by stamping a metal plate, and the other portion of the metal plate is defined as the board 11.

Moreover, the support 12 in the present embodiment is disposed at a substantial center portion of the board 11, and the at least one coaxial connector 13 is arranged at an outer side of the support 12. According to design requirements, the at least one coaxial connector 13 can be fastened to the board 11 by passing through the board 11 or being disposed on a board surface of the board 11.

Based on the material or the structural design of the elastic cushion 2, the elastic cushion 2 can be elastically deformable after being pressed. Moreover, the elastic cushion 2 in the present embodiment can be made of an insulative and resilient material (e.g., the elastic cushion 2 can be a silicone cushion), but the present disclosure is not limited thereto. The elastic cushion 2 is disposed on the support 12 of the supporting member 1, and outer lateral surfaces of the elastic cushion 2 in the present embodiment are respectively flush with outer lateral surfaces of the support 12. In other words, the support 12 is sandwiched between the elastic cushion 2 and the board 11.

Specifically, the elastic cushion 2 has a plurality of partition slots 21 so as to define a plurality of independent elastic segments 22. In other words, the elastic cushion 2 can be divided into the independent elastic segments 22 by forming the partition slots 21. Each of the partition slots 21 in the present embodiment can inwardly extend from outer lateral surfaces of the elastic cushion 2, and the partition slots 21 are in a ring-shaped arrangement, but the present disclosure is not limited thereto. For example, in other embodiments of the present disclosure, the partition slots 21 can be in a ring shape, and the independent elastic segment 22 is surrounded by the partition slots 21.

The thin-film sheet 3 defines an outer region 3a, an inner region 3b spaced apart from the outer region 3a along a height direction H, and an extension region 3c that is connected to the outer region 3a and the inner region 3b. In the present embodiment, the size and the position of the inner region 3b correspond to those of the elastic cushion 2, and the extension region 3c is obliquely connected to the outer region 3a and the inner region 3b.

The thin-film sheet 3 includes a sheet-like carrier 31, a plurality of signal circuits 32 disposed on the carrier 31, and a plurality of conductive protrusions 33 that are respectively disposed on the signal circuits 32. The carrier 31 is preferably made of an insulative material, and can be a single-layer structure or a multi-layer structure according to design requirements. A portion of the carrier 31 arranged in the inner region 3b has a plurality of grooves 312 so as to divide the portion of the carrier 31 into a plurality of action segments 311 respectively disposed on the independent elastic segments 22.

In the present embodiment, each of the grooves 312 of the carrier 31 extends from the inner region 3b to the extension region 3c. That is to say, each of the action segments 311 is arranged in the inner region 3b and the extension region 3c, but the present disclosure is not limited thereto. For example, in other embodiments of the present disclosure, each of the grooves 312 of the carrier 31 can extend from the inner region 3b to the outer region 3a, so that each of the action segments 311 is arranged in the inner region 3b, the extension region 3c, and the outer region 3a.

Moreover, the partition slots 21 respectively correspond in position to and are respectively in spatial communication with the grooves 312 along the height direction H, and the action segments 311 are flatly disposed on the independent elastic segments 22, respectively. In the present embodiment, the partition slots 21 are one-to-one in spatial communication with the grooves 312, respectively, so that the action segments 311 are disposed one-to-one on the independent elastic segments 22, respectively, but the present disclosure is not limited thereto. For example, in other embodiments of the present disclosure, the partition slots 21 can be many-to-one in spatial communication with the grooves 312, respectively, so that the action segments 311 are disposed of many-to-one on the independent elastic segments 22, respectively.

The signal circuits 32 are formed on the carrier 31, and each of the signal circuits 32 extends from the outer region 3a to the inner region 3b and can be in a linear shape or an irregular shape, but the present disclosure is not limited thereto. Moreover, portions of the signal circuits 32 arranged in the inner region 3b are respectively disposed on the action segments 311.

In the present embodiment, the portions of the signal circuits 32 arranged in the inner region 3b are respectively disposed on the action segments 311 on a one-to-one basis, but the present disclosure is not limited thereto. For example, in other embodiments of the present disclosure, the portions of the signal circuits 32 arranged in the inner region 3b can be respectively disposed on the action segments 311 on a many-to-one basis.

Figure 1:
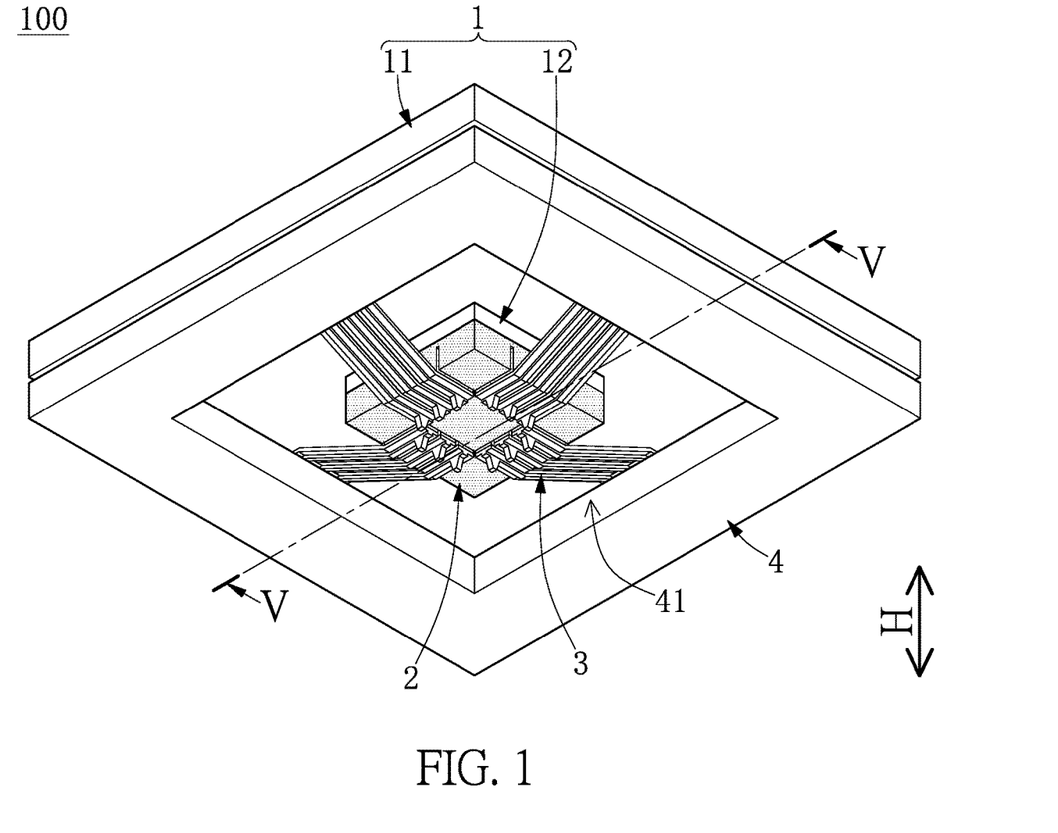
FIG. 1 is a perspective view of a split thin-film probe card according to a first embodiment of the present disclosure.
Figure 2:
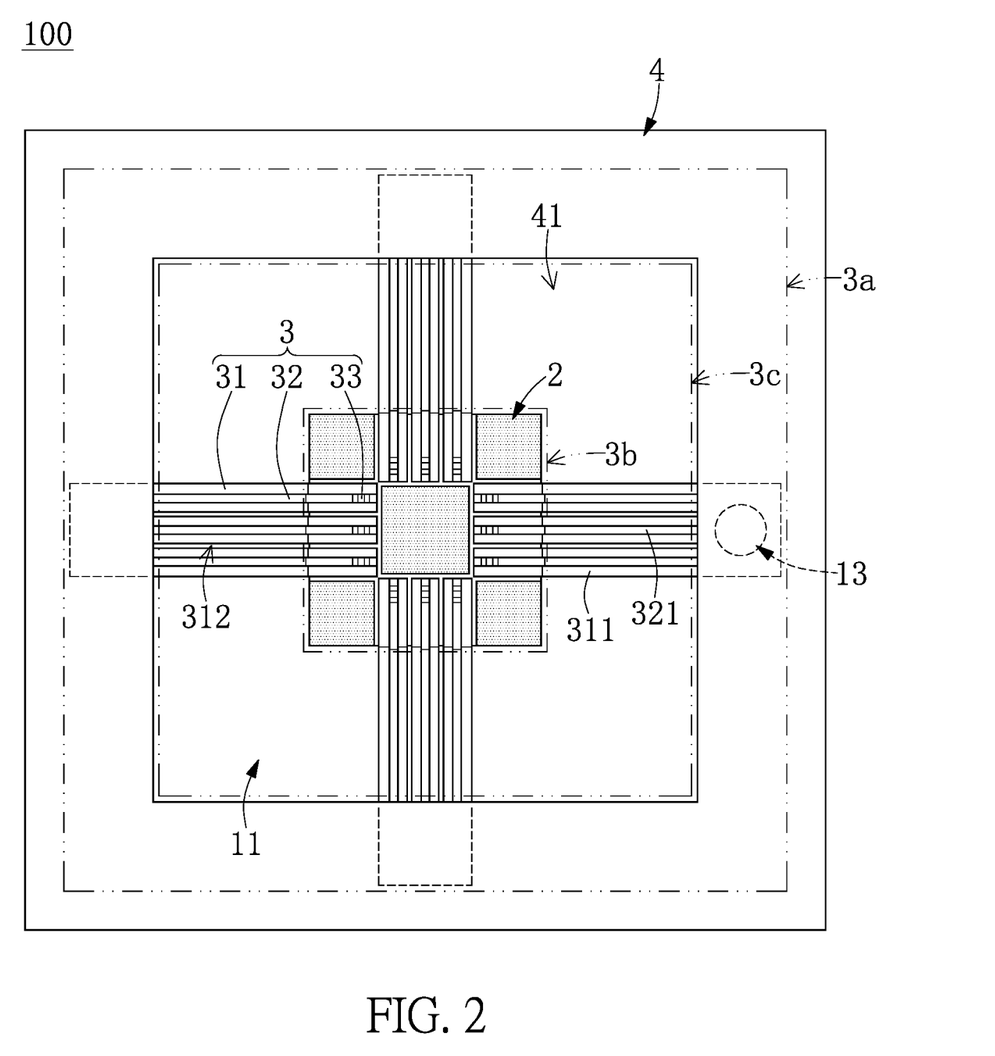
FIG. 2 is a bottom view of FIG. 1.
Figure 3:
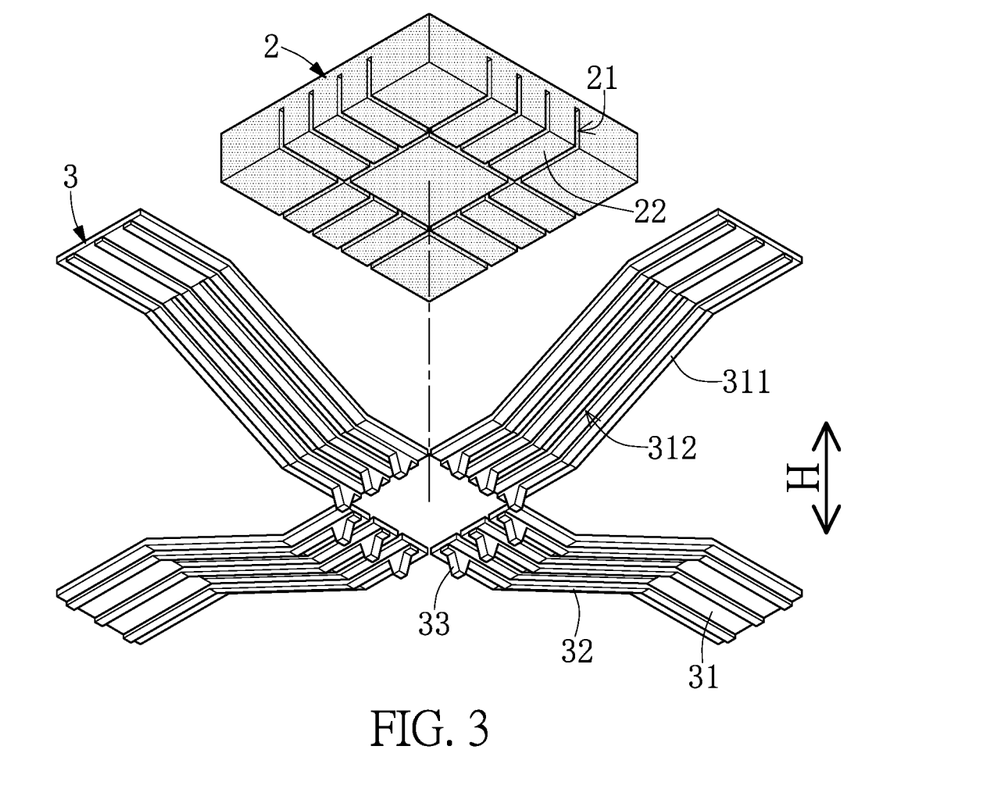
FIG. 3 is an exploded view of an elastic module according to the first embodiment of the present disclosure.
Figure 4:
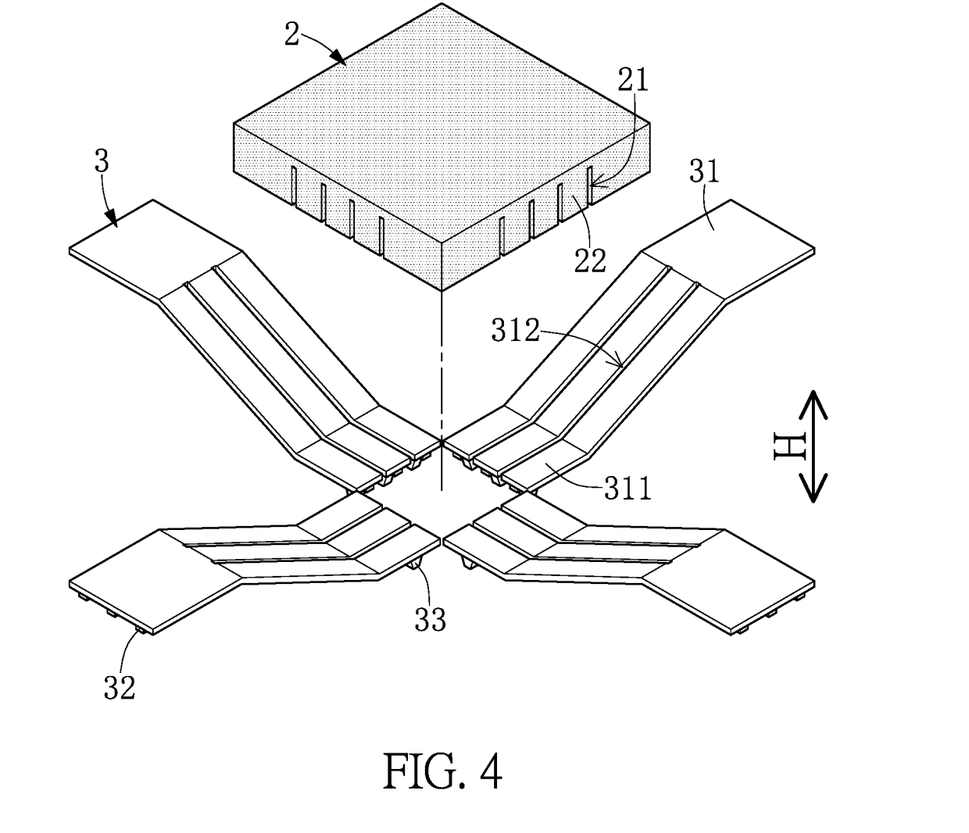
FIG. 4 is an exploded view of the elastic module from another angle of view according to the first embodiment of the present disclosure.
Figure 5:
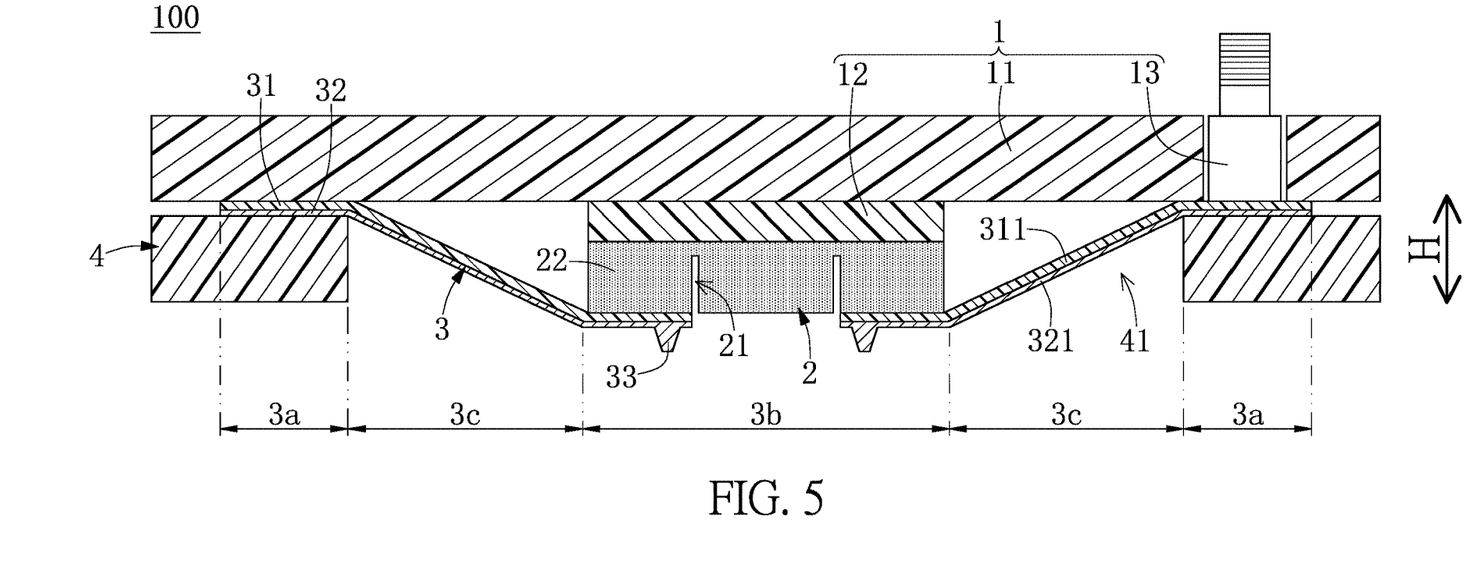
FIG. 5 is a cross-sectional view taken along line V-V of FIG. 1.

Moreover, the signal circuits 32 of the thin-film sheet 3 have at least one high-frequency signal circuit 321, and a portion of the at least one high-frequency signal circuit 321 arranged in the outer region 3a is connected to the at least one coaxial connector 13, so that the split thin-film probe card 100 can be used to stably and precisely transmit a high-frequency signal by a cooperation of the at least one high-frequency signal circuit 321 and the at least one coaxial connector 13. In addition, according to design requirements, the at least one coaxial connector 13 can be perpendicularly connected to the at least one high-frequency signal circuit 321 (as shown in FIG. 5) or can be horizontally connected to the at least one high-frequency signal circuit 321 (not shown in the figures).

The conductive protrusions 33 are arranged in the inner region 3b and are in a ring-shaped arrangement. The conductive protrusions 33 are respectively formed on the signal circuits 32. In the present embodiment, each of the conductive protrusions 33 is integrally connected to the corresponding signal circuit 32. In other words, each of the conductive protrusions 33 and the corresponding signal circuit 32 are made of the same material.

Specifically, each of the conductive protrusions 33 in the present embodiment is a tapered metal structure that can be in a conical shape, a pyramidical shape, a truncated cone shape, or a truncated pyramid shape, but the present disclosure is not limited thereto. In the present embodiment, each of the conductive protrusions 33 corresponds in position to one of the signal circuits 32, one of the action segments 311, and one of the independent elastic segments 22 along the height direction H.

Furthermore, when any one of the conductive protrusions 33 is pressed, only the corresponding independent elastic segment 22 is deformed through the corresponding signal circuit 32 and the corresponding action segment 311, so that a movement linkage of the conductive protrusions 33 of the split thin-film probe card 100 can be reduced. Accordingly, the conductive protrusions 33 of the split thin-film probe card 100 can be acted upon a uniform force, and can be firmly abutted against metal pads of a DUT (not shown in the figures). Specifically, the test region (or the distribution range of the conductive protrusions 33) of the split thin-film probe card 100 can be wider.

The circuit board 4 has an accommodating hole 41 that is used to accommodate the inner region 3b and the extension region 3c of the thin-film sheet 3, but the present disclosure is not limited thereto. The supporting member 1 is fixed on the circuit board 4, the elastic cushion 2 and a portion of the thin-film sheet 3 (e.g., the inner region 3b and the extension region 3c) are arranged in the accommodating hole 41, and each of the conductive protrusions 33 protrudes from the accommodating hole 41 to abut against the DUT.

Specifically, at least one of the signal circuits 32 is electrically coupled to the circuit board 4. In the present embodiment, the signal circuits 32 of the thin-film sheet 3 excluding the at least one high-frequency signal circuit 321 are electrically coupled to the circuit board 4. The electrical coupling between the circuit board 4 and the at least one of the signal circuits 32 can be formed in a soldering manner, a pressing connection manner, a manner implemented by a connector, or a manner implemented by a reed, but the present disclosure is not limited thereto.

Second Embodiment

Figure 6:
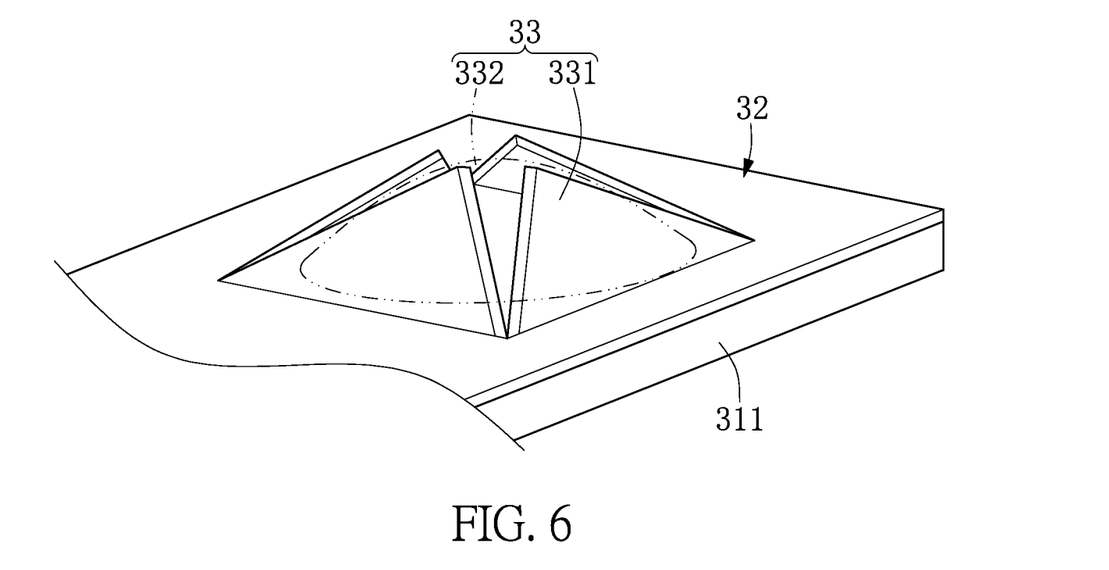
FIG. 6 is a perspective view showing a part (e.g., a conductive protrusion and corresponding portions) of a thin-film sheet of a split thin-film probe card according to a second embodiment of the present disclosure.

Referring to FIG. 6, a second embodiment of the present disclosure is similar to the first embodiment of the present disclosure. For the sake of brevity, descriptions of the same components in the first and second embodiments of the present disclosure will be omitted herein, and the following description only discloses different features between the first and second embodiments.

In the present embodiment, each of the conductive protrusions 33 includes a claw-like metal structure 331 electrically coupled to the corresponding signal circuit 32 and an elastomer 332 (e.g., a silicone or a foam) that is arranged inside of the claw-like metal structure 331. In each of the conductive protrusions 33, the claw-like metal structure 331 is elastically deformable by pressing against the elastomer 332. Accordingly, the conductive protrusions 33 can firmly abut against a DUT.

Third Embodiment

Figure 7:
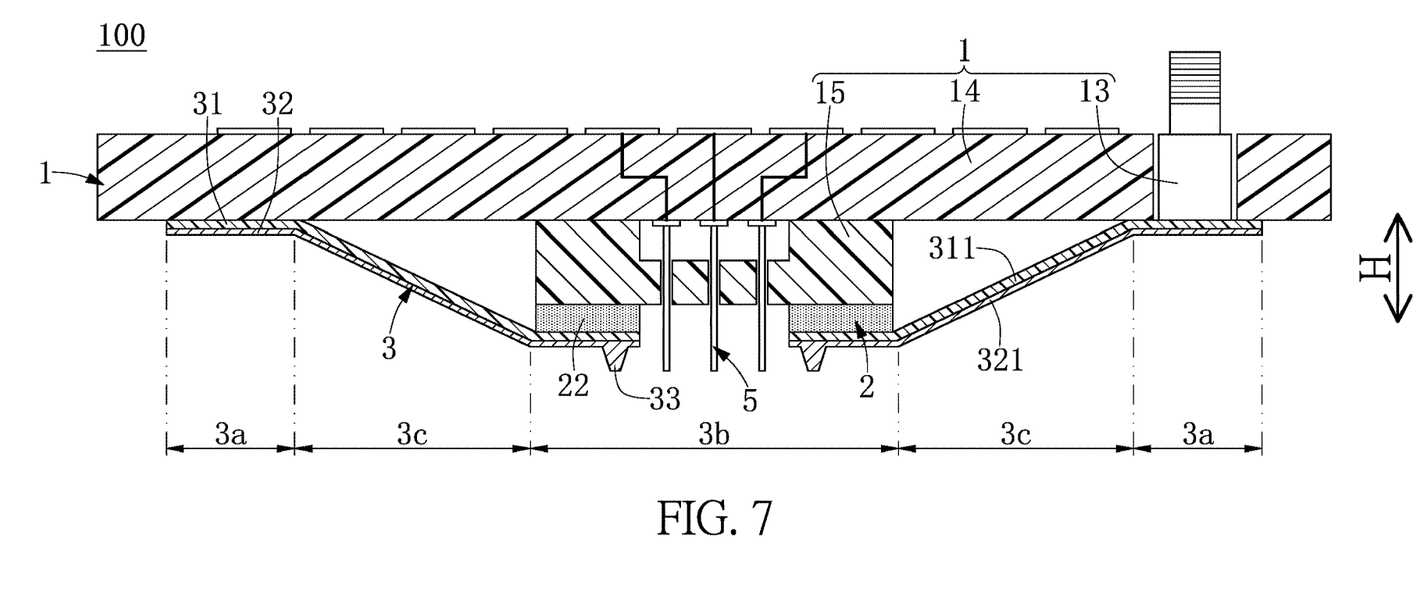
FIG. 7 is a cross-sectional view of a split thin-film probe card according to a third embodiment of the present disclosure.

Referring to FIG. 7, a third embodiment of the present disclosure is similar to the first and second embodiments of the present disclosure. For the sake of brevity, descriptions of the same components in the first to third embodiments of the present disclosure will be omitted herein, and the following description only discloses different features between the first embodiment and the second embodiment.

In the present embodiment, the split thin-film probe card 100 further includes a plurality of vertical probes 5 and does not have the circuit board 4. The supporting member 1 includes a space transformer 14 and a carrying unit 15 that is sandwiched between the space transformer 14 and the elastic cushion 2. In other words, the space transformer 14 and the carrying unit 15 of the present embodiment are used to respectively replace the board 11 and the support 12, and the at least one coaxial connector 13 is mounted on the space transformer 14.

Moreover, the carrying unit 15 in the present embodiment is a guide board assembly (e.g., the guide board assembly includes an upper die, a lower die, and a spacer that is sandwiched between the upper die and the lower die), but the present disclosure is not limited thereto. In addition, the structure of the vertical probe 5 and the structure of the carrying unit 15 can be adjusted according to design requirements, and are not limited to the present embodiment.

In addition, at least one of the signal circuits 32 is electrically coupled to the space transformer 14. In the present embodiment, the signal circuits 32 of the thin-film sheet 3 excluding the at least one high-frequency signal circuit 321 are electrically coupled to the space transformer 14. The electrically coupling manner between the space transformer 14 and at least one of the signal circuits 32 can be a soldering manner, a pressing connection manner, a manner implemented by a connector, or a manner implemented by a reed, but the present disclosure is not limited thereto.

The vertical probes 5 are fixed in position at the carrying unit 15. Specifically, one end of each of the vertical probes 5 is arranged at an inner side of the conductive protrusions 33 and is preferably coplanar with free ends of the conductive protrusions 33, and another end of each of the vertical probes 5 is connected to and is electrically coupled to the space transformer 14. Moreover, the coplanar arrangement in the present embodiment allows a reasonable tolerance to occur. Accordingly, the conductive protrusions 33 of the thin-film sheet 3 and the vertical probes 5 can jointly form an array of detection points, thereby expanding the application and the test range of the split thin-film probe card 100.

In conclusion, in the split thin-film probe card and the elastic module of the present disclosure, by virtue of "when any one of the conductive protrusions is pressed, only the corresponding independent elastic segment is deformed through the corresponding signal circuit and the corresponding action segment", a movement linkage of the conductive protrusions of the split thin-film probe card (or the elastic module) can be reduced. Accordingly, the conductive protrusions can be acted upon with a more uniform force, and can firmly abut against metal pads of a DUT. Specifically, the test region (or the distribution range of the conductive protrusions) of the split thin-film probe card can be widened.

Moreover, in the split thin-film probe card of the present disclosure, by virtue of "the at least one high-frequency signal circuit is connected to the at least one coaxial connector," the split thin-film probe card can be used to stably and precisely transmit a high-frequency signal by the at least one high-frequency signal circuit and the at least one coaxial connector.

Furthermore, in the split thin-film probe card of the present disclosure, by virtue of "the claw-like metal structure of each of the conductive protrusions is elastically deformable by pressing against the elastomer," the conductive protrusions 33 can firmly abut against a DUT."

In addition, in the split thin-film probe card of the present disclosure, the conductive protrusions of the thin-film sheet and the vertical probes can jointly form a testing point array, thereby expanding the application and the test object of the split thin-film probe card."

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A split thin-film probe card, comprising:
   a supporting member;
   an elastic cushion disposed on the supporting member, wherein the elastic cushion has a plurality of partition slots so as to define a plurality of independent elastic segments;
   a thin-film sheet defining an outer region, an inner region spaced apart from the outer region along a height direction, and an extension region that is connected to the outer region and the inner region, wherein the thin-film sheet includes:
     a carrier having a portion arranged in the inner region, wherein the portion of the carrier has a plurality of grooves so as to divide the portion of the carrier into a plurality of action segments respectively disposed on the independent elastic segments;
     a plurality of signal circuits disposed on the carrier, wherein portions of the signal circuits arranged in the inner region are respectively disposed on the action segments; and
     a plurality of conductive protrusions arranged in the inner region and respectively formed on the signal circuits, wherein when any one of the conductive protrusions is pressed, only the corresponding independent elastic segment is deformed through the corresponding signal circuit and the corresponding action segment; and
   a circuit board having an accommodating hole, wherein the supporting member is fixed on the circuit board, the elastic cushion and a portion of the thin-film sheet are arranged in the accommodating hole, and each of the conductive protrusions protrudes from the accommodating hole, and wherein at least one of the signal circuits is electrically coupled to the circuit board.

2. The split thin-film probe card according to claim 1, wherein the supporting member further includes at least one coaxial connector, the signal circuits of the thin-film sheet have at least one high-frequency signal circuit, and a portion of the at least one high-frequency signal circuit arranged in the outer region is connected to the at least one coaxial connector.

3. The split thin-film probe card according to claim 1, wherein each of the grooves of the carrier extends from the inner region to the extension region, and each of the conductive protrusions is integrally connected to the corresponding signal circuit and is a tapered metal structure.

4. The split thin-film probe card according to claim 1, wherein each of the conductive protrusions includes a claw-like metal structure electrically coupled to the corresponding signal circuit and an elastomer that is arranged inside of the claw-like metal structure, and wherein in each of the conductive protrusions, the claw-like metal structure is elastically deformable by pressing against the elastomer.

5. The split thin-film probe card according to claim 1, wherein the elastic cushion is defined as a silicone pad, the partition slots respectively correspond in position to and are respectively in spatial communication with the grooves along the height direction, and the action segments are flatly disposed on the independent elastic segments, respectively.

6. A split thin-film probe card, comprising:
   a supporting member;
   an elastic cushion disposed on the supporting member, wherein the elastic cushion has a plurality of partition slots so as to define a plurality of independent elastic segments; and
   a thin-film sheet defining an outer region, an inner region spaced apart from the outer region along a height direction, and an extension region that is connected to the outer region and the inner region, wherein the thin-film sheet includes:
     a carrier having a portion arranged in the inner region, wherein the portion of the carrier has a plurality of grooves so as to divide the portion of the carrier into a plurality of action segments respectively disposed on the independent elastic segments;

a plurality of signal circuits disposed on the carrier, wherein portions of the signal circuits arranged in the inner region are respectively disposed on the action segments; and a plurality of conductive protrusions arranged in the inner region and respectively formed on the signal circuits, wherein when any one of the conductive protrusions is pressed, only the corresponding independent elastic segment is deformed through the corresponding signal circuit and the corresponding action segment;

wherein the supporting member includes a space transformer and a carrying unit that is sandwiched between the space transformer and the elastic cushion, at least one of the signal circuits is electrically coupled to the space transformer, and the conductive protrusions of the thin-film sheet are in a ring-shaped arrangement;

wherein the split thin-film probe card further includes a plurality of vertical probes fixed in position at the carrying unit, wherein one end of each of the vertical probes is arranged at an inner side of the conductive protrusions, and another end of each of the vertical probes is connected to and is electrically coupled to the space transformer.

* * * * *